(12) United States Patent
Tanno et al.

(10) Patent No.: US 10,998,211 B2
(45) Date of Patent: May 4, 2021

(54) MANAGEMENT SYSTEM, METHOD, AND COMPUTER PROGRAM FOR SEMICONDUCTOR FABRICATION APPARATUS

(71) Applicant: Fujikin Incorporated, Osaka (JP)

(72) Inventors: Ryutaro Tanno, Osaka (JP); Takahiro Mastuda, Osaka (JP); Tsutomu Shinohara, Osaka (JP)

(73) Assignee: Fujikin Inc., Osaka (JP)

( * ) Notice: Subject to any disclaimer, the term of this patent is extended or adjusted under 35 U.S.C. 154(b) by 0 days.

(21) Appl. No.: 16/615,398

(22) PCT Filed: May 15, 2018

(86) PCT No.: PCT/JP2018/018668
§ 371 (c)(1),
(2) Date: Nov. 20, 2019

(87) PCT Pub. No.: WO2018/221198
PCT Pub. Date: Dec. 6, 2018

(65) Prior Publication Data
US 2020/0185242 A1 Jun. 11, 2020

(30) Foreign Application Priority Data

May 31, 2017 (JP) .............................. JP2017-108544

(51) Int. Cl.
*H01L 21/67* (2006.01)
*G06T 7/73* (2017.01)
(Continued)

(52) U.S. Cl.
CPC .. *H01L 21/67294* (2013.01); *G05B 19/41865* (2013.01); *G06T 7/0004* (2013.01);
(Continued)

(58) Field of Classification Search
None
See application file for complete search history.

(56) References Cited

U.S. PATENT DOCUMENTS

2008/0285854 A1* 11/2008 Kotake ..................... G06T 7/73
382/190
2011/0309842 A1* 12/2011 Behzad .............. G01R 31/3025
324/501
(Continued)

FOREIGN PATENT DOCUMENTS

JP 2003-343761 A1 12/2003
JP 2006-258151 A1 9/2006
(Continued)

OTHER PUBLICATIONS

Espacenet English translation of WO 2014/030256 A1 (Year: 2014).*

*Primary Examiner* — Jayanti K Patel
*Assistant Examiner* — Stefan Gadomski
(74) *Attorney, Agent, or Firm* — Chris Mizumoto

(57) ABSTRACT

In a semiconductor fabrication apparatus composed of a plurality of components, such as fluid control devices, a manager is to be enabled to identify components by intuition. Information on the identified component is to be provided to the manager in an easy-to-understand manner. In a system in which a manager terminal 3 and an information processor 2 are communicably configured via networks NW1 and NW2, the manager terminal 3 receives component information on a semiconductor fabrication apparatus 1 from the information processor 2. Upon the identification of the position of a component constituting the semiconductor fabrication apparatus 1 on the captured image of the semiconductor fabrication apparatus 1 using an identification processing unit 32, a compositing processing unit 33 creates a composite image in which component information is composited with the captured image at the position of the (Continued)

component identified, and an image display unit 34 displays the composite image. On the other hand, the information processor 2 makes reference to the component information storage unit 2A to extract the component information using an extraction processing unit 21, and transmits the component information to the manager terminal 3.

9 Claims, 12 Drawing Sheets

(51) Int. Cl.
  *G05B 19/418* (2006.01)
  *G06T 7/00* (2017.01)
  *H04N 7/18* (2006.01)

(52) U.S. Cl.
  CPC .......... *G06T 7/73* (2017.01); *H01L 21/67276* (2013.01); *H04N 7/18* (2013.01); *G05B 2219/45031* (2013.01); *G06T 2207/30148* (2013.01)

(56) References Cited

U.S. PATENT DOCUMENTS

| | | | | |
|---|---|---|---|---|
| 2012/0075430 A1* | 3/2012 | Ito | ............................... | G06T 7/73 348/47 |
| 2012/0219228 A1* | 8/2012 | Osako | .................. | G06K 9/3275 382/199 |
| 2012/0321173 A1* | 12/2012 | Mitarai | ..................... | G06T 7/73 382/154 |
| 2012/0327117 A1* | 12/2012 | Weller | .................. | G06T 19/006 345/633 |
| 2014/0015957 A1* | 1/2014 | Fujikawa | .................. | G06T 7/74 348/95 |
| 2014/0098132 A1* | 4/2014 | Fein | ...................... | G06T 19/006 345/633 |
| 2014/0328534 A1* | 11/2014 | Lin | ....................... | G06T 7/0006 382/149 |
| 2015/0201167 A1* | 7/2015 | Yamaji | ..................... | H04N 5/44 348/86 |
| 2015/0260505 A1* | 9/2015 | Nagano | ..................... | G06T 7/73 348/135 |
| 2016/0104276 A1* | 4/2016 | Engel | ................. | G01N 21/8851 382/141 |
| 2016/0171773 A1* | 6/2016 | Hara | .................... | G06T 19/006 345/633 |
| 2016/0321530 A1* | 11/2016 | Troy | .................. | G06K 7/10881 |
| 2016/0358383 A1* | 12/2016 | Gauglitz | ............... | G06T 19/006 |
| 2016/0371559 A1* | 12/2016 | Yang | ......................... | G06T 7/73 |
| 2017/0075116 A1* | 3/2017 | Gardiner | ................... | G06T 7/73 |
| 2017/0109856 A1* | 4/2017 | Inazumi | ................... | B25J 9/1697 |
| 2017/0261740 A1* | 9/2017 | Miller | .................. | G02B 21/365 |
| 2018/0068158 A1* | 3/2018 | Hiroi | .................... | G06T 1/0007 |
| 2018/0101943 A1* | 4/2018 | Konopacki | ............... | G06T 7/60 |
| 2018/0101964 A1* | 4/2018 | Lee | ............. | G06T 7/70 |
| 2018/0108147 A1* | 4/2018 | Kim | .................. | G06F 3/0308 |
| 2018/0253859 A1* | 9/2018 | Abrial | ........................ | G06T 7/70 |
| 2018/0321776 A1* | 11/2018 | Averyanov | .............. | G06F 3/048 |
| 2019/0000318 A1* | 1/2019 | Caluser | ................ | A61B 8/5261 |
| 2019/0043385 A1* | 2/2019 | Inoue | ..................... | G09B 19/24 |
| 2019/0103037 A1* | 4/2019 | Lussier | .............. | G09B 19/0069 |
| 2019/0358547 A1* | 11/2019 | Mack | .................. | A63F 13/5255 |
| 2019/0369717 A1* | 12/2019 | Frielinghaus | ........... | G06F 3/012 |

FOREIGN PATENT DOCUMENTS

| | | |
|---|---|---|
| JP | 2014-123873 A1 | 7/2014 |
| JP | 2017-40557 A1 | 2/2017 |
| WO | WO2014/030256 A1 | 2/2014 |

\* cited by examiner

FIG. 3

| APPARATUS ID | COMPONENT INFORMATION | | | | | |
|---|---|---|---|---|---|---|
| | COMPONENT ID | COORDINATES INFORMATION | ALERT INFORMATION | SENSING INFORMATION | ADDITIONAL INFORMATION | MANUAL |
| A001 | P001001 | ⋯ | ⋯ | ⋯ | ⋯ | ⋮ |
| | P001002 | ⋯ | — | ⋯ | ⋯ | |
| ⋮ | ⋮ | ⋮ | ⋮ | ⋮ | ⋮ | |

MANAGEMENT SYSTEM, METHOD, AND COMPUTER PROGRAM FOR SEMICONDUCTOR FABRICATION APPARATUS

CROSS-REFERENCE

This application is a national phase of an international application, PCT/JP2018/018668 filed on May 15, 2018, which claims the benefit of Japanese Application No. 2017-108544 filed on May 31, 2017.

TECHNICAL FIELD

The present invention relates to a technique that individually discriminates and manages components constituting a semiconductor fabrication apparatus.

BACKGROUND ART

A gas box used for a semiconductor fabrication apparatus has a structure in which a large number of gas lines formed of fluid control devices having the same or almost the same configurations are integrated and mounted in an array. In the manual operation of this gas box or the replacement of the fluid control device for maintenance, it has been necessary to carefully check whether a device at an actually correct place is under maintenance work among a large number of fluid control devices in an array while making reference to a diagram showing passage configurations.

Nowadays, the development that aims for lifetime prediction or labor saving for maintenance in which a sensor is installed on a fluid control device, such as a valve, to collect data relating to the operation status of the fluid control device. With this method, information which fluid controller needs replacement or maintenance is obtained. However, similarly to the description above, since fluid control devices in the same or almost the same configurations are in an array, careful attention is necessary in order not to mistake an operation target.

On this point, Patent Literature 1 proposes a valve management support system is proposed which automatically identifies the opening and closing state of a valve by capturing a valve from the side using a camera of a terminal, and while identifying the valve using a two-dimensional barcode, recognizing at which height a handle imaged on the camera is present.

Patent Literature 2 proposes a valve operation support system in which a terminal reads a barcode to identify a valve, and a valve operation instruction is displayed on the terminal.

CITATION LIST

Patent Literature

Patent Literature 1: JP 2006-258151 A
Patent Literature 2: JP 2003-343761 A

SUMMARY OF INVENTION

Technical Problem

Although both of the techniques described in Patent Literatures 1 and 2 have the function that identifies a valve by image processing, it is a trouble that a specific valve is searched while confirming a large number of valves one by one, and even though this specific valve can be searched, the specific valve might be lost or mistaken in the later work because a large number of valves are integrated. Because of these reasons, a system is desired in which a component targeted for work is instructed to an operator with no mistake among a large number of valves in an array.

Therefore, an object of the present invention is to enable a manager to identify respective components in a semiconductor fabrication apparatus composed of a plurality of components, such as fluid control devices. Further, an object is to provide information on the identified component to the manager in an easy-to-understand manner.

Solution to Problem

In order to achieve the objects, a management system for a semiconductor fabrication apparatus from the viewpoint of the position of the present invention is a management system for a semiconductor fabrication apparatus composed of a plurality of integrated components, in which a manager terminal used by a manager managing the semiconductor fabrication apparatus and an information processor configured to hold component information on the semiconductor fabrication apparatus are communicably configured via a network, the manager terminal includes a capturing means configured to capture the semiconductor fabrication apparatus, a component information receiving means configured to receive component information on the semiconductor fabrication apparatus from the information processor, an identification processing means configured to identify a position of a component constituting the semiconductor fabrication apparatus on a captured image of the semiconductor fabrication apparatus, a compositing processing means configured to create a composite image in which component information on the identified component is composited with a captured image of the semiconductor fabrication apparatus at a position of the identified component, and an image display means configured to display the composite image, and the information processor includes a component information storing means configured to store component information on a component constituting the semiconductor fabrication apparatus, an extraction processing means configured to make reference to the component information storing means to extract the component information, and a component information transmitting means configured to transmit the component information to the manager terminal.

Here, the component in the present invention means a valve, a controller, or a fluid control device, for example, constituting a semiconductor fabrication apparatus, and any name or any configuration unit is included as long as components constitute the semiconductor fabrication apparatus.

On the semiconductor fabrication apparatus, a marker is attached at a predetermined place, and the identification processing means may identify a position of a component constituting the semiconductor fabrication apparatus on the captured image of the semiconductor fabrication apparatus based on relative coordinates of respective components relative to the attachment place of the marker, and the component information storing means may further store information relating to relative coordinates of respective components relative to the attachment place of the marker as component information.

The semiconductor fabrication apparatus has a predetermined identification label attached to four or more components, and the identification processing means may identify a position of a component constituting the semiconductor fabrication apparatus on the captured image of the semiconductor fabrication apparatus based on relative coordinates of respective components relative to the attachment place of the identification label, and the component information storing means may further store information relating to relative coordinates of respective components relative to the attachment place of the identification label as component information.

The semiconductor fabrication apparatus has a sensing information transmitting means communicably configured with the semiconductor fabrication apparatus via a network, the sensing information transmitting means being configured to transmit sensing information obtained by sensing operation status of respective components on the information processor, and the information processor may further have a sensing information receiving means configured to receive the sensing information from the semiconductor fabrication apparatus, and a first registration means configured to make reference to the component information storing means to register the sensing information as the component information.

The manager terminal may further have an input means configured to accept an input of additional information specifying a predetermined component on the composite image from the manager, and an additional information transmitting means configured to transmit the inputted additional information to the information processor together with specification of the predetermined component, and the information processor may further have a second registration means configured to make reference to the component information storing means to register the additional information as the component information.

The manager terminal further may have an image control means configured to detect an amount of movement according to movement of the manager terminal to control the composite image according to the amount of movement.

The manager terminal may further have a recording means configured to record a task by the manager based on the composite image.

A management method of a semiconductor fabrication apparatus from another viewpoint according to the present invention is a method of managing a semiconductor fabrication apparatus composed of a plurality of integrated components, and in a system in which a manager terminal used by a manager managing the semiconductor fabrication apparatus and an information processor including a component information storing means configured to store component information on a component constituting the semiconductor fabrication apparatus are communicably configured via a network, the manager terminal executes a capturing process of capturing the semiconductor fabrication apparatus, a component information receiving process of receiving component information on the semiconductor fabrication apparatus from the information processor, an identifying process of identifying a position of a component constituting the semiconductor fabrication apparatus on the captured image of the semiconductor fabrication apparatus, a compositing process of a creating a composite image in which component information on the identified component is composited with the captured image of the semiconductor fabrication apparatus at a position of the identified component, and an image display process of displaying the composite image, and the information processor executes an extracting process of making reference to the component information storing means to extract the component information, and a component information transmission process of transmitting the component information to the manager terminal.

A computer program from further another viewpoint according to the present invention is a computer program that manages a semiconductor fabrication apparatus composed of a plurality of integrated components, and in a system in which a manager terminal used by a manager managing the semiconductor fabrication apparatus and an information processor including a component information storing means configured to store component information on a component constituting the semiconductor fabrication apparatus are communicably configured via a network, the computer program causes the manager terminal to execute a capturing process of capturing the semiconductor fabrication apparatus, a component information receiving process of receiving component information on the semiconductor fabrication apparatus from the information processor, an identifying process of identifying a position of a component constituting the semiconductor fabrication apparatus on the captured image of the semiconductor fabrication apparatus, a compositing process of a creating a composite image in which component information on the identified component is composited with the captured image of the semiconductor fabrication apparatus at a position of the identified component, and an image display process of displaying the composite image, and the computer program causes the information processor to execute an extracting process of making reference to the component information storing means to extract the component information, and a component information transmission process of transmitting the component information to the manager terminal.

Note that the computer program can be provided by downloading the computer program via the network, such as an Internet, or can be provided by recording the computer program on various readable recording media.

Advantageous Effects of Invention

According to the present invention, in a semiconductor fabrication apparatus composed of a plurality of components, a manager can identify the respective components by intuition. Furthermore, information on the identified component is provided for a manager in an easy-to-understand manner.

BRIEF DESCRIPTION OF DRAWINGS

FIG. 3 is a diagram showing an example of data stored in a component information storage unit in the management system for the semiconductor fabrication apparatus according to the embodiment.

DESCRIPTION OF EMBODIMENTS

In the following, a management system for a semiconductor fabrication apparatus according to an embodiment of the present invention will be described.

Figure 1:
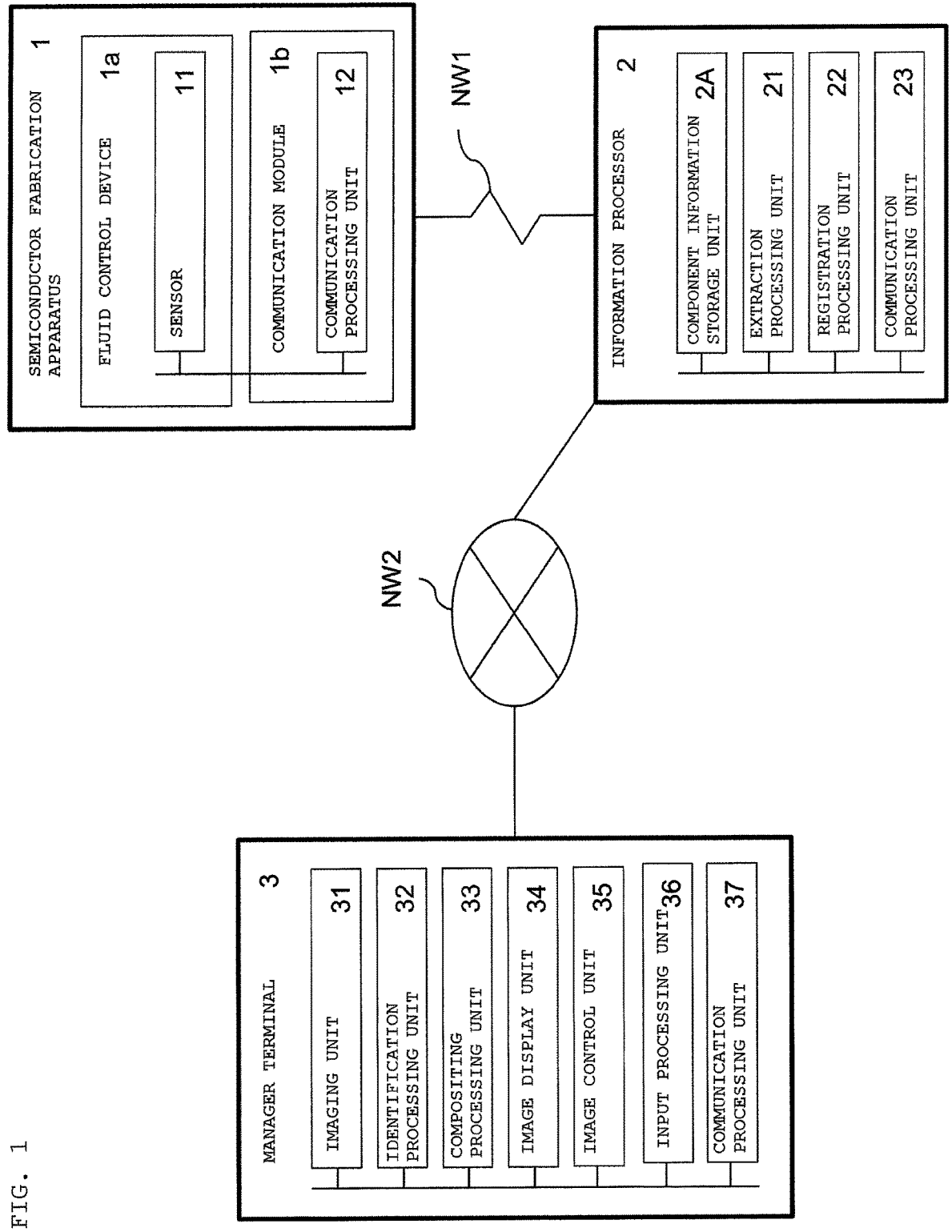
FIG. 1 is a functional block diagram showing the functions of a management system for a semiconductor fabrication apparatus according to a first embodiment of the present invention.

As shown in FIG. 1, the management system for the semiconductor fabrication apparatus according to the embodiment is composed of a semiconductor fabrication apparatus 1, an information processor 2, and a manager terminal 3. The semiconductor fabrication apparatus 1, the information processor 2, and the manager terminal 3 are communicably configured via networks NW1 and NW2, in which information is transmitted and received.

Note that in this example, the network NW1 is formed by radio communications including Bluetooth (registered trademark), infrared communication, or Zigbee (registered trademark), for example, and the network NW2 is formed of a wireless LAN, for example. However, in another embodiment, the terminals and any other components can be connected in a method different from this example, and for example, all the terminals and any other components can also be connected by a wireless LAN.

Figure 2:
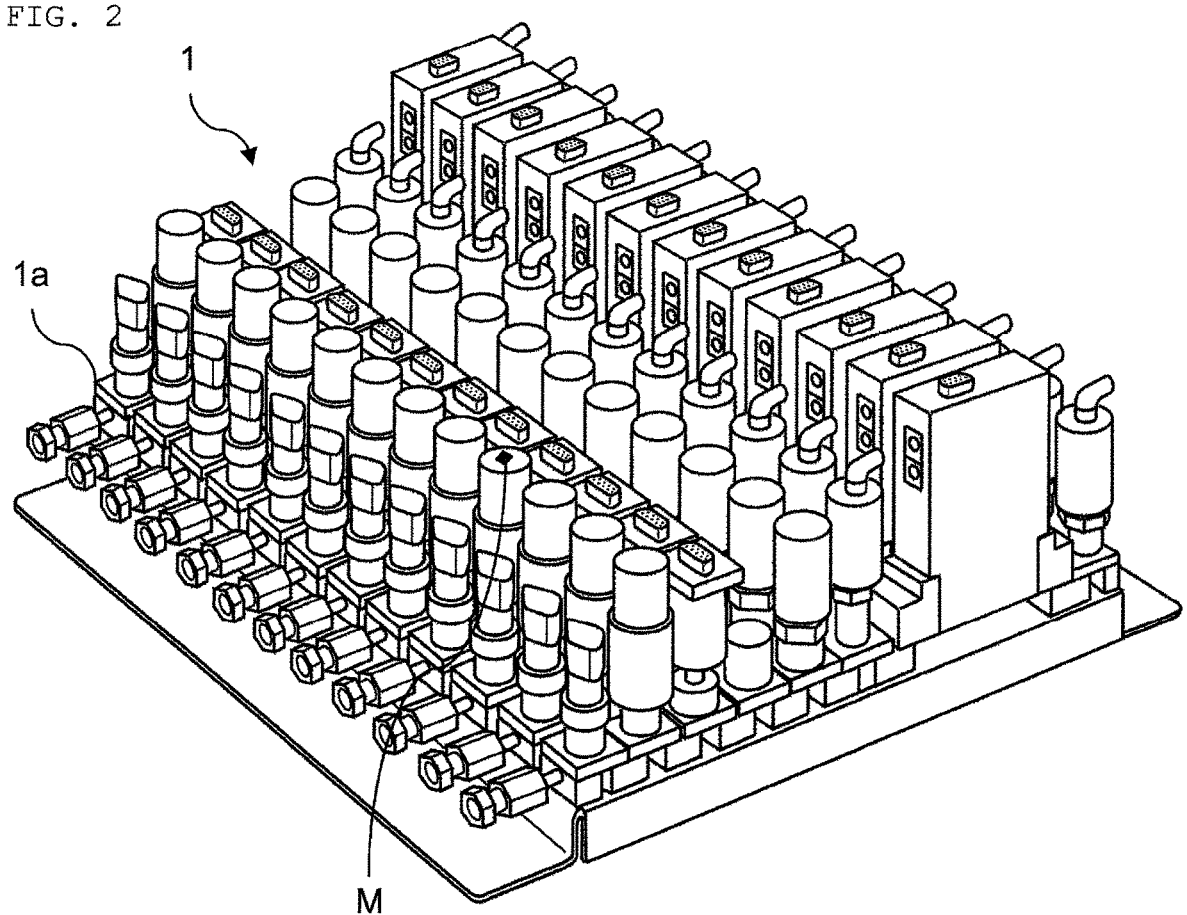
FIG. 2 is an external perspective view showing a gas supply system of the semiconductor fabrication apparatus, the gas supply system being managed by the management system for the semiconductor fabrication apparatus according to the embodiment.

As shown in FIG. 2, the semiconductor fabrication apparatus 1 is an apparatus having a plurality of fluid control devices 1a densely integrated, and is composed of a plurality of components, including valves and controllers.

This semiconductor fabrication apparatus 1 has a sensor 11 and a communication module 1b that are built in.

The sensor 11 detects the flow rate and temperature of a fluid, the pressure of a predetermined space in the fluid control device 1a, and the position of the component constituting the fluid control device 1a, or example. This sensor 11 is connected to the communication module 1b, and supplies sensing information that sensor 11 obtains by sensing to the communication module 1b.

The communication module 1b includes a communication processing unit 12 configured to execute the transmission and reception of data to and from the information processor 2 communicably configured via the network. Upon receiving the supply of sensing information from the sensor 11, the communication module 1b transmits the sensing information to the information processor 2 using the communication processing unit 12 via the network NW1.

To the semiconductor fabrication apparatus 1, a marker M is attached at a predetermined place that is visually recognizable from the outside. The marker M is an indicator used for alignment in creating a composite image, described later, in augmented reality (AR). This marker M is identified by the manager terminal 3, and hence the position of the manager terminal 3 or the relative position of the component from the marker M that is a starting point can be recognized. Such a marker M is formed of a pattern image that an apparatus ID unique to the semiconductor fabrication apparatus 1 is coded, for example.

The information processor 2 is a device that provides component information on a component constituting the semiconductor fabrication apparatus 1 to the manager terminal 3.

This information processor 2 is configured of hardware sources including a central processing unit (CPU), a random access memory (RAM), a read only memory (ROM), and a hard disk drive (HDD) that store computer programs executed by the CPU, computer programs, and predetermined pieces of data, and includes functional units formed of a component information storage unit 2A, an extraction processing unit 21, a registration processing unit 22, and a communication processing unit 23.

The component information storage unit 2A is a storage unit that stores component information on a component constituting the semiconductor fabrication apparatus 1.

As shown in FIG. 3, the component information storage unit 2A stores component information on a component constituting the semiconductor fabrication apparatus 1 for each apparatus ID that identifies the semiconductor fabrication apparatus 1, for example. The component information includes information relating to a component ID that identifies a component, coordinates information, alert information, sensing information obtained by the sensor 11 of the semiconductor fabrication apparatus 1, and additional information optionally inputted by the manager. As the component information, information on each of the components as well as manuals, such as an assembly method for the semiconductor fabrication apparatus 1 and a maintenance method, and information, such as a block diagram of the passage of the semiconductor fabrication apparatus 1, maybe stored together.

The coordinates information is information relating to the relative coordinates of the respective components relative to the attachment place of the marker M, and with this coordinates information, the positions of the respective components in the semiconductor fabrication apparatus 1 can be identified.

The alert information is information on failure determination or failure prediction by comparison of a predetermined threshold based on sensing information. In the case in which the alert information is stored, the alert information may be forcedly displayed on a composite image when the composite image is displayed on the manager terminal 3.

The sensing information includes information, such as the number of times of opening and closing the valve, the present opening and closing state, and temperatures.

The extraction processing unit 21 executes a process of making reference to the component information storage unit 2A to extract component information in response to a request from the manager terminal 3.

The registration processing unit 22 makes reference to the component information storage unit 2A to register the sensing information received from the semiconductor fabrication apparatus 1 as component information. The registration processing unit 22 makes reference to the component information storage unit 2A to register additional information accepted from the manager as component information.

The communication processing unit 23 is a processing unit that executes the transmission and reception of data to and from the semiconductor fabrication apparatus 1 and the manager terminal 3 via the networks NW1 and NW2.

The information processor 2 can transmit component information to the manager terminal 3 and can receive sensing information from the semiconductor fabrication apparatus 1 using this communication processing unit 23.

The manager terminal 3 is a terminal that is held and operated by the manager who manages the semiconductor fabrication apparatus 1, and is implemented by a smart device having a camera function, for example.

Note that in this example, the term "management or manager" should not be narrowly interpreted by the meaning of the word, and the term "management" includes tasks performed under the observation the semiconductor fabrication apparatus 1, such as the repair and assembly of the semiconductor fabrication apparatus 1, and the term "manager" includes an operator who performs these tasks.

This manager terminal 3 is configured of hardware sources including a CPU and a memory, such as a RAM and a ROM that store computer programs executed by the CPU, computer programs, and predetermined pieces of data, and includes functional units formed of an imaging unit 31, an identification processing unit 32, a compositing processing unit 33, an image display unit 34, an image control unit 35, an input processing unit 36, and a communication processing unit 37.

The imaging unit 31 is a processing unit that captures the semiconductor imaging apparatus 1 as a subject. The imaging unit 31 is composed of a lens that forms a subject image on the light receiving surface of an image pickup device, the image pickup device, such as a CMOS image sensor, that captures the subject image formed through the lens and outputs image signals to a control unit, and the control unit that creates a captured image from the image signals acquired from the image pickup device.

Note that the captured image created by the imaging unit 31 is an actual real time image of the semiconductor fabrication apparatus 1.

The identification processing unit 32 executes a process of identifying the position of a component constituting the semiconductor fabrication apparatus 1 on the captured image of the semiconductor fabrication apparatus 1.

The identification processing unit 32 detects the marker M on the captured image of the semiconductor fabrication apparatus 1, and identifies the position of a component constituting the semiconductor fabrication apparatus 1 based on the relative coordinates of the respective components relative to the attachment place of the marker M. The detection of the marker M can be achieved by recognizing the identified image in the captured image based on the identified image of the marker M held on a predetermined table, for example.

The compositing processing unit 33 executes a process of creating a composite image in which component information is composited with the captured image of the semiconductor fabrication apparatus 1 at the position of the component identified by the identification processing unit 32.

The image display unit 34 is composed of a display, such as a liquid crystal panel, and displays a captured image or a composite image on the display.

Note that although the composite image is displayed on the manager terminal as a real time image by the image display unit 34, the term "real time" described here is not a precise coincidence, and capture and display are regarded as coincidence because the time lag between capture and display due to processing, for example, by the compositing processing unit 33 or the image control unit 35 is extremely minute.

The image control unit 35 executes a process of detecting the amount of movement according to the movement of the imaging unit 31 and controlling the composite image according to the amount of movement.

This image control unit 35 is composed of a single sensor or a combination of a plurality of sensors, such as an acceleration sensor or an angular acceleration sensor, and a functional unit that matches the composite image according to the amount of movement the imaging unit 31 detected by the sensor.

More specifically, when the moving distance or the moving angle of the imaging unit 31 is measured by the sensor as the amount of movement of the imaging unit 31, the position or angle of the imaging unit 31 is estimated corresponding to the moving distance or the moving angle that is measured. Correspondingly to this, the position of the component on the composite image after the imaging unit 31 having moved is estimated, and the display position of component information on the composite image is matched.

The input processing unit 36 is composed of a touch panel, keyboard, a pointing device, and any other device. The manager terminal 3 can accept the input of additional information specifying a predetermined component from the manager on the composite image using the input processing unit 36.

The communication processing unit 37 is configured of a browser program and any other component, and is a processing unit that executes the transmission and reception of data to and from the information processor 2 via the network NW2.

The manager terminal 3 can receive the component information on the semiconductor fabrication apparatus 1 from the information processor 2, or can transmit inputted additional information by the manager together with the specification of a predetermined component to the information processor 2 using the communication processing unit 37.

Next, a process flow by the management system for the semiconductor fabrication apparatus according to the embodiment will be described.

Figure 4:
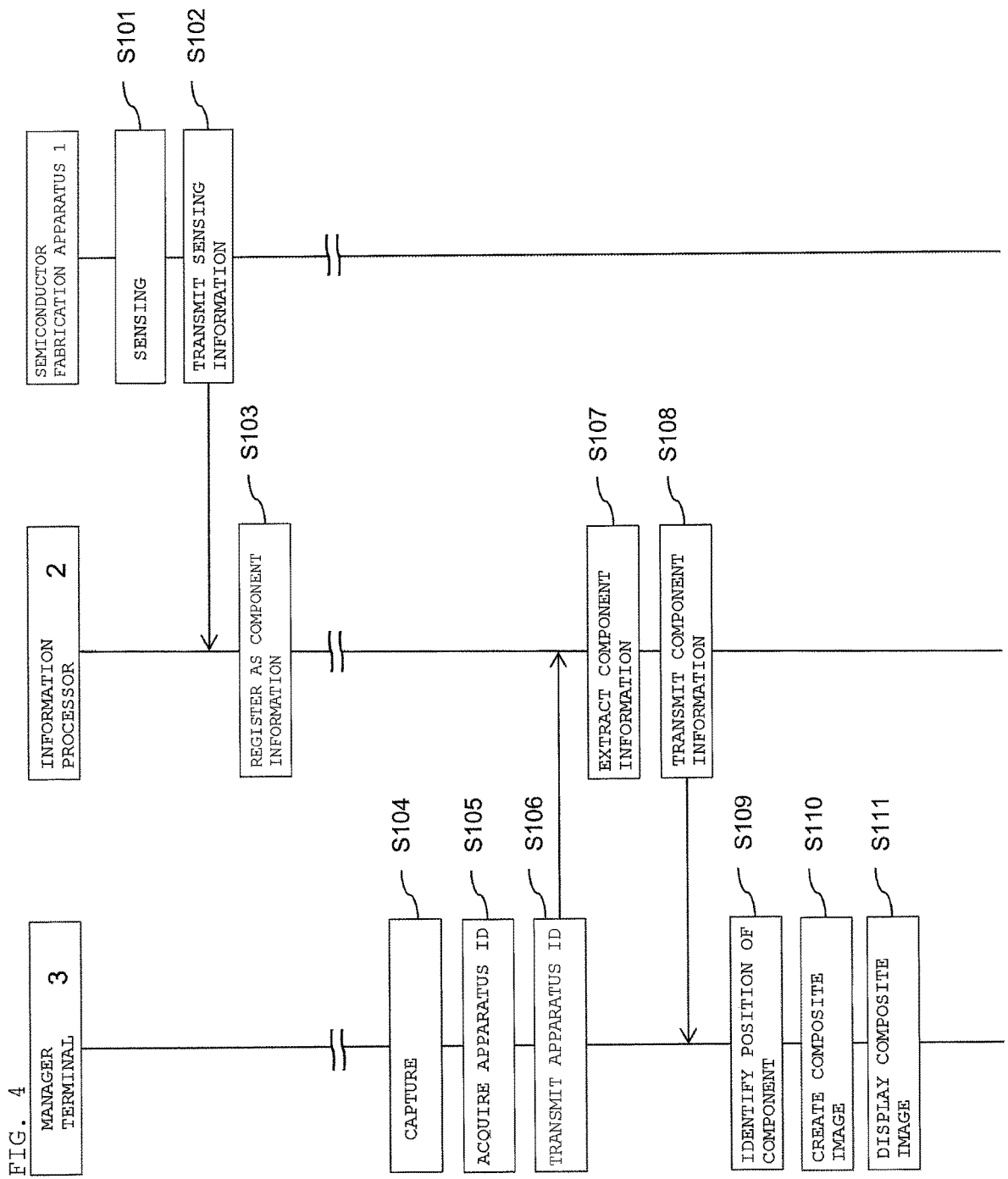
FIG. 4 is a sequence diagram showing a process flow of the management system for the semiconductor fabrication apparatus according to the embodiment.

As shown in FIG. 4, in the semiconductor fabrication apparatus 1, the sensor 11 conducts sensing all the time or a predetermined timing (S101). The communication processing unit 12 of the communication module 1b transmits sensing information to the information processor 2 (S102), and the sensing information is registered in the component information storage unit 2A (S103).

In order to manage the semiconductor fabrication apparatus 1, the manager starts capture by the imaging unit 31 (S104). The apparatus ID of the semiconductor fabrication apparatus 1 is acquired (S105), and the apparatus ID is transmitted to the information processor 2 together with an acquiring request for component information (S106).

Note that acquiring the apparatus ID is possible by a method with which a directly input is made to the manager terminal 3 or the marker M that the apparatus ID is coded as a pattern image is captured and decoded, for example. In the case in which the marker M that the apparatus ID is coded as a pattern image and decoded, decoding can also be performed in the information processor 2.

Correspondingly to this, the information processor 2 makes reference to the component information storage unit 2A using the extraction processing unit 21, and extracts the component information based on the apparatus ID (S107). The extracted component information is transmitted to the manager terminal 3 (S108).

Note that the component information extracted here includes at least coordinates information on each component.

On the other hand, the manager terminal 3 executes a process of identifying the position of a component constituting the semiconductor fabrication apparatus 1 on the captured image of the semiconductor fabrication apparatus 1 using the identification processing unit 32 (S109). In this process, first, the marker M is detected on the captured image of the semiconductor fabrication apparatus 1. The positions of the respective components are identified from the relative position of each component relative to the attachment place of the marker M based on the coordinates information on each component included in the component information.

Upon the identification of the positions of the components, the compositing processing unit 33 creates a composite image on which component information is composited with the positions of the respective components based on the captured image of the semiconductor fabrication apparatus 1 (S110). The composite image is displayed on the manager terminal 3 by the image display unit 34 (S111).

Here, an exemplary screen displayed on the manager terminal 3 will be described.

Figure 5:
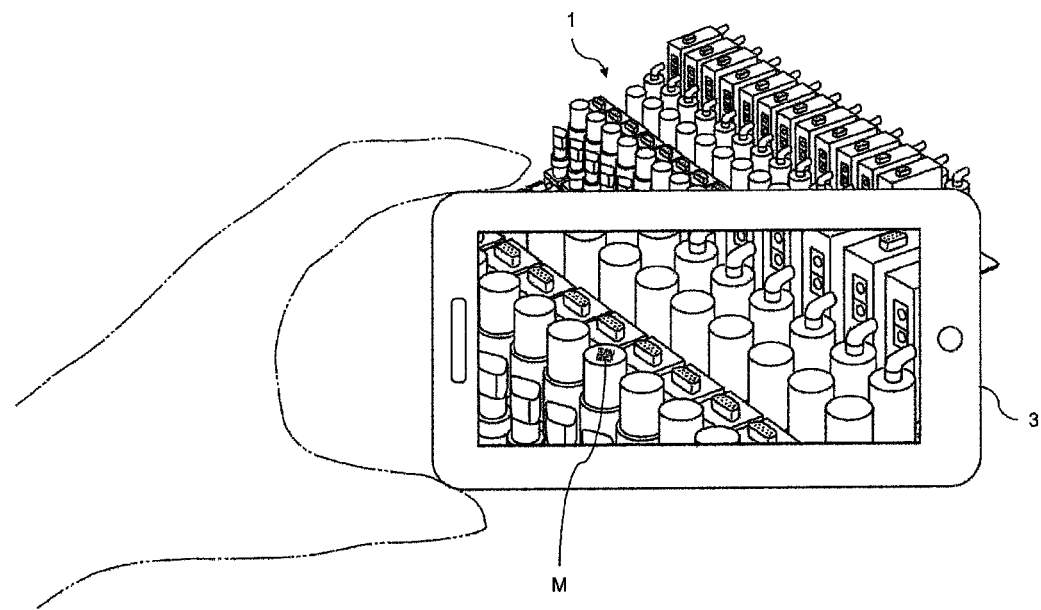
FIG. 5 is a diagram showing an exemplary screen displayed on a manager terminal in the management system for the semiconductor fabrication apparatus according to the embodiment.

FIG. 5 shows the captured image of the semiconductor fabrication apparatus 1 imaged on the manager terminal 3. On the captured image, the marker M attached at a predetermined place on the semiconductor fabrication apparatus 1 is imaged, and the marker M is detected by the identification processing unit 32.

Figure 6:
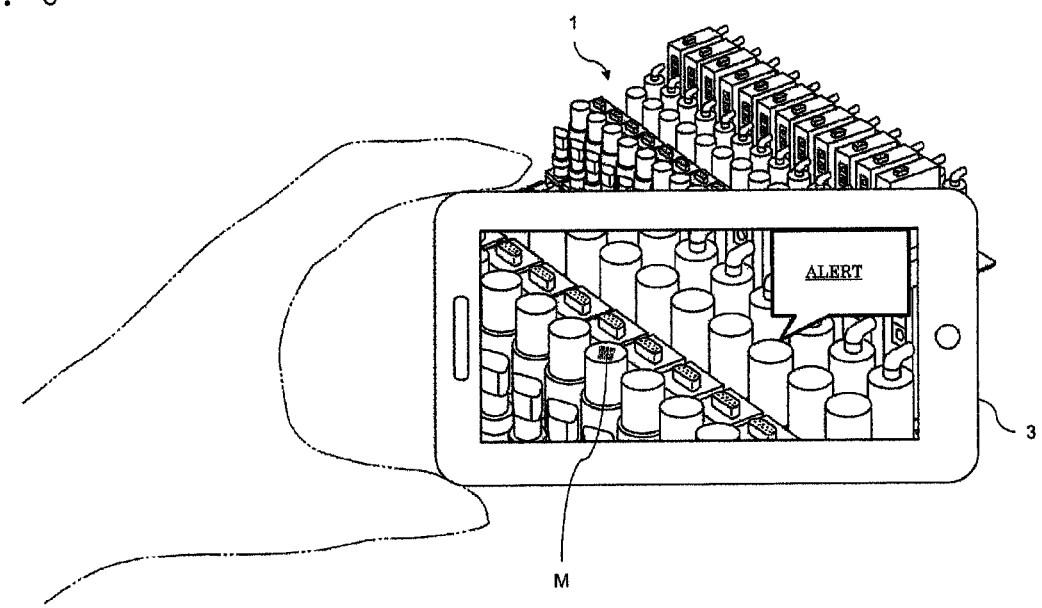
FIG. 6 is a diagram showing an exemplary screen displayed on the manager terminal in the management system for the semiconductor fabrication apparatus according to the embodiment.

FIG. 6 shows the composite image of the semiconductor fabrication apparatus 1 imaged on the manager terminal 3. An example of this composite image shows the case in which alert information is transmitted from the information processor 2 to the manager terminal 3, and in the composite image, alert information (in the drawing, displayed as "ALERT") is displayed at a predetermined component recognized relative to the attachment place of the marker M.

Figure 7:
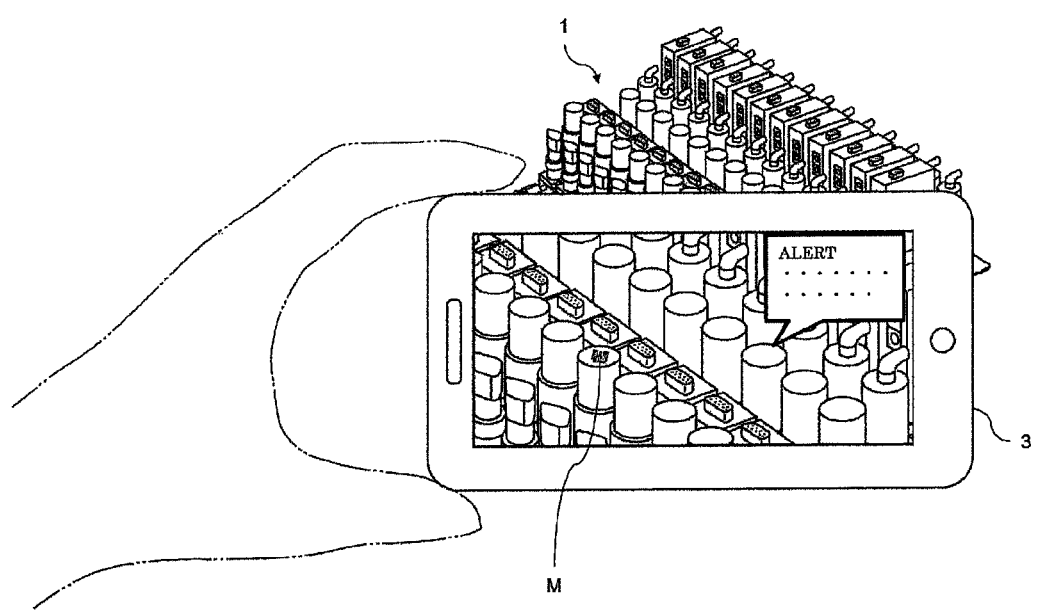
FIG. 7 is a diagram showing an exemplary screen displayed on the manager terminal in the management system for the semiconductor fabrication apparatus according to the embodiment.

Note that in the example in FIG. 6, a link is set to the alert information, and when the link is specified, as shown in FIG. 7, the detail of the alert information is provided from the information processor 2 and displayed.

Figure 8:
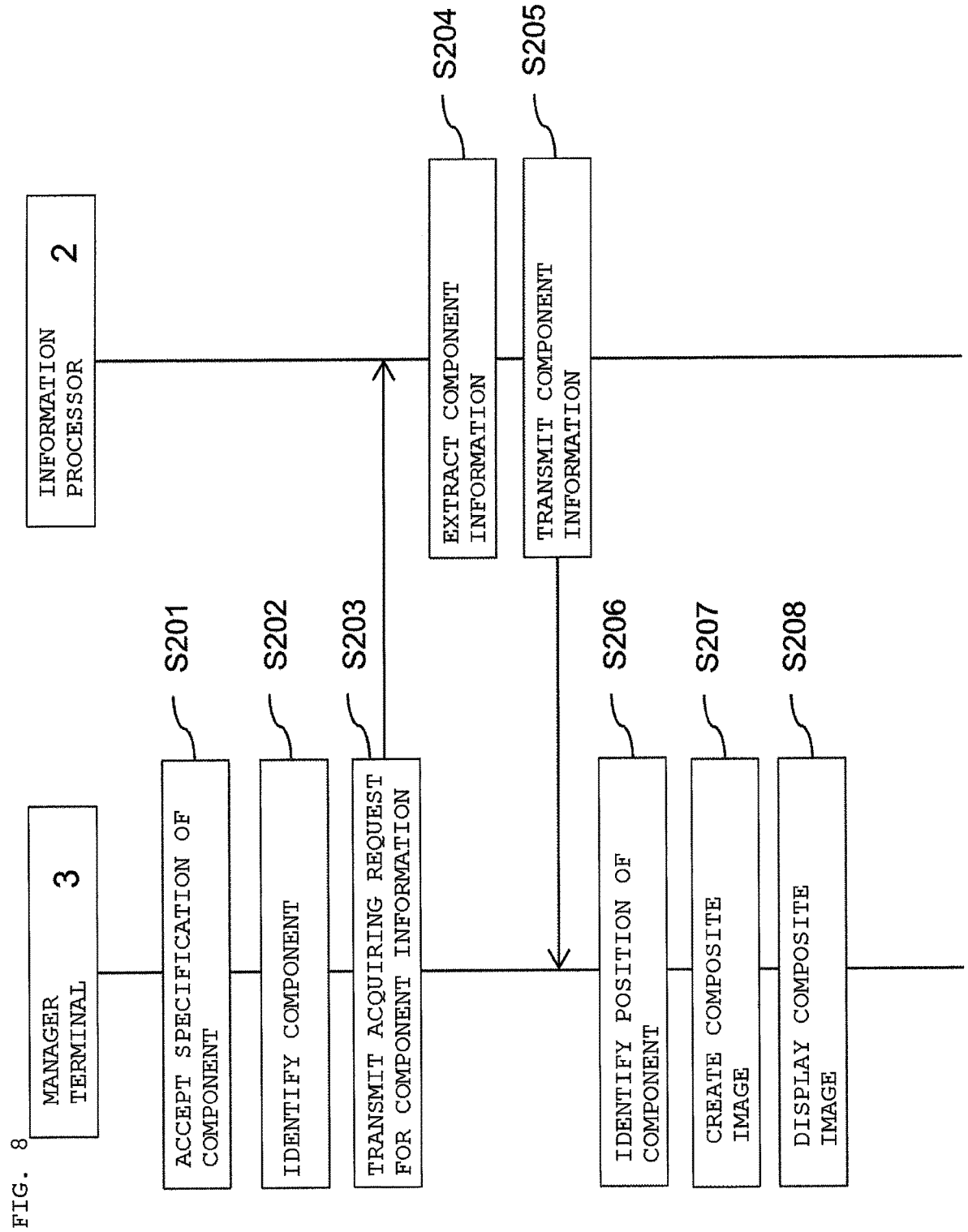
FIG. 8 is a sequence diagram showing a process flow of the management system for the semiconductor fabrication apparatus according to the embodiment.

Next, referring to FIG. 8, a process flow will be described in which a predetermined component is specified by the manager from the manager terminal 3 on which the composite image is displayed, and component information on the specified predetermined component is displayed.

First, on the composite image displayed by the image display unit 34, the manager terminal 3 accepts an acquiring request for component information from the manager together with the specification of a predetermined component (S201). Note that the acquiring request for component information can be recognized in which menu display is performed when the component is specified, for example, and the item of the acquiring request for component information shown in the menu display is specified.

The identification processing unit 32 recognizes the position specified by the manager based on the coordinates in the composite image, and thus identifies the component displayed at the coordinates as the component specified by the manager (S202). The communication processing unit 37 transmits an acquiring request for the component information on the specified component to the information processor 2 (S203).

Correspondingly to this, the information processor 2 makes reference to the component information storage unit 2A using the extraction processing unit 21, and then the component information on the specified component is extracted (S204), the information processor 2 transmits the component information to the manager terminal 3 using the communication processing unit (S205).

In the manager terminal 3, upon the identification of the position of the component displaying the received component information by the identification processing unit 32 (S206), the compositing processing unit 33 creates a composite image composited with the component information at the identified position (S207). The created composite image is displayed on the manager terminal 3 by the image display unit 34 (S208), and thus the manager can make reference to information on the component specified by the manager him/herself.

Here, an exemplary screen displayed on the manager terminal 3 will be described in the case in which the manager specifies a predetermined component and makes reference to component information.

Figure 9:
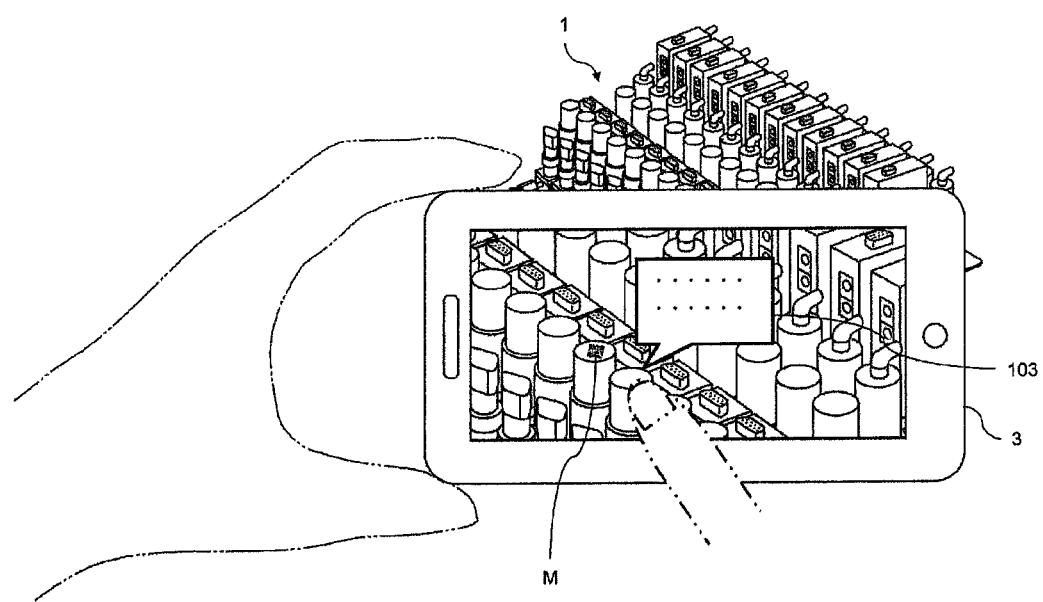
FIG. 9 is a diagram showing an exemplary screen displayed on the manager terminal in the management system for the semiconductor fabrication apparatus according to the embodiment.

FIG. 9 shows the composite image of the semiconductor fabrication apparatus 1 imaged on the manager terminal 3. In an example of this composite image, component information on a component specified by the manager is displayed in a manner that the specified component can be identified. That is, in this example, the specified component can be identified among a plurality of components by balloon display to the specified component.

Note that the method that can identify the specified component, for example, by the manager in the composite image is not limited to the balloon display described above, and various forms can be adopted, such as color display to the specified component.

Figure 10:
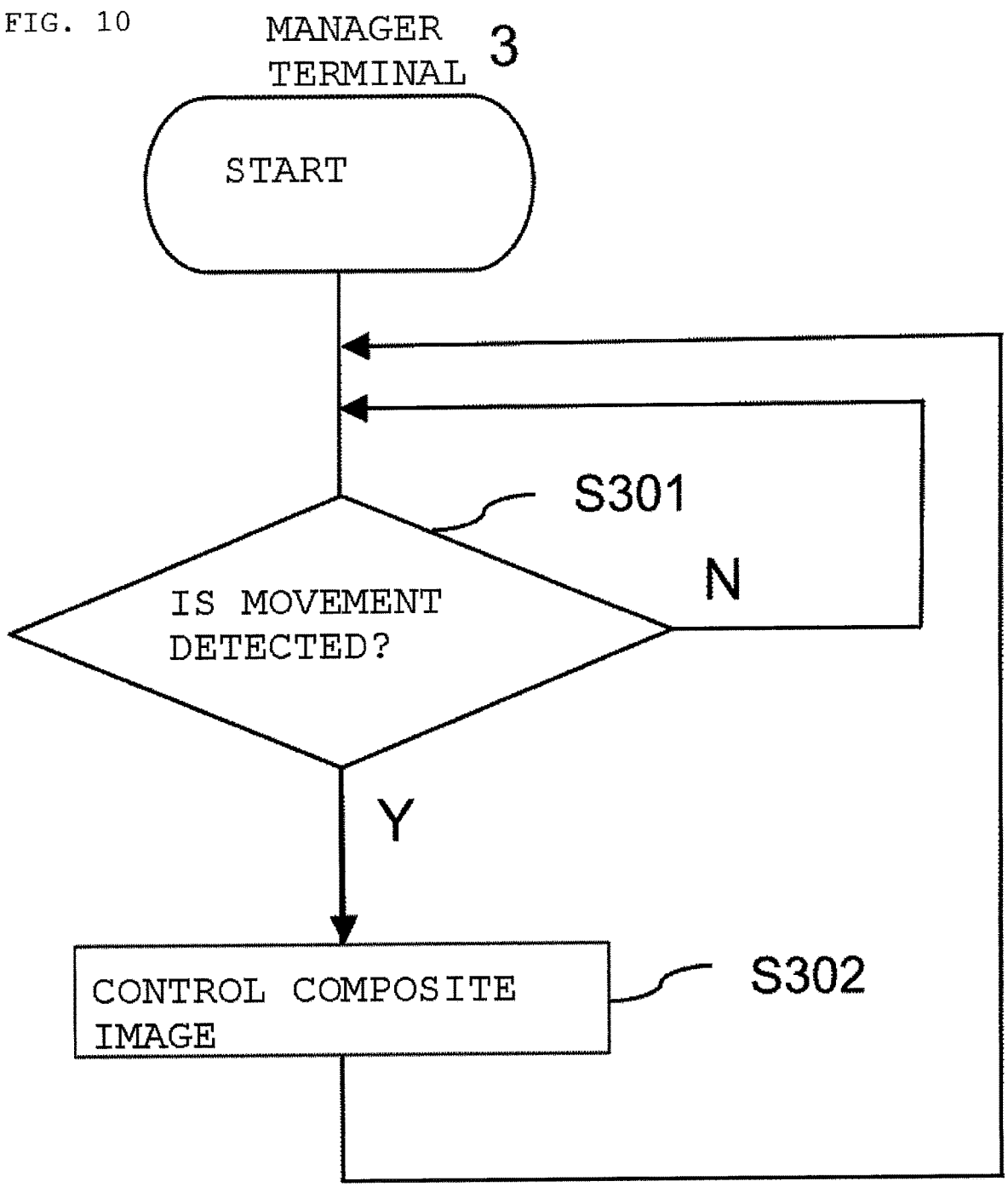
FIG. 10 is a process flowchart showing a process flow of the management system for the semiconductor fabrication apparatus according to the embodiment.

Next, referring to FIG. 10, a process will be described in which the composite image is controlled corresponding to the move of the manager terminal 3.

First, in the manager terminal 3, during the display of the composite image, the image control unit 35 detects the amount of movement of the imaging unit 31 all the time (S301).

Upon the detection of the amount of movement of the imaging unit 31, the imaging unit 31 is matched according to the amount of movement of the detected composite image (S302). That is, upon the measurement of the moving distance of the imaging unit 31 or the moving angle as the amount of movement of the imaging unit 31, the position or angle of the imaging unit 31 is estimated corresponding to the moving distance or the moving angle that is measured. Correspondingly to this, the position of the component on the composite image after the imaging unit 31 having moved is estimated, and the display position of component information on the composite image is matched.

The image control of this composite image is executed all the time at least during the display of the composite image. Thus, after the position of the component is identified based on the marker M, the position of the component is matched on the manager terminal 3, and an appropriate composite image can be maintained, and hence the response speed can improved, and natural display of component information can be performed. Since the semiconductor fabrication apparatus 1 itself is not moved basically, a change in the relative position of the manager terminal 3 is continuously followed, and hence at which part the target component is imaged on the composite image can be accurately estimated.

Figure 11:
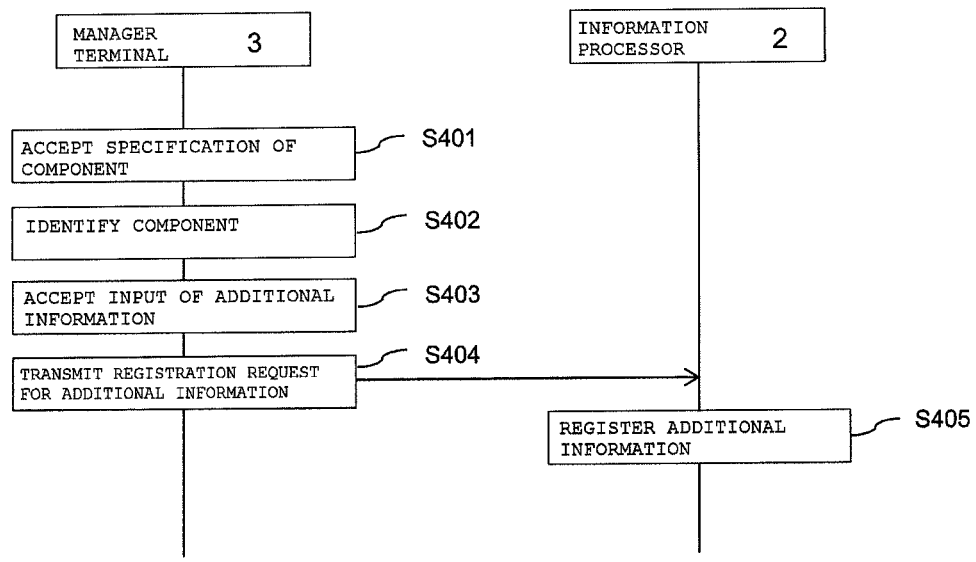
FIG. 11 is a sequence diagram showing a process flow of the management system for the semiconductor fabrication apparatus according to the embodiment.

Next, referring to FIG. 11, a process flow will be described in the case in which additional information to a predetermined component is registered by the manager.

On the composite image displayed by the image display unit 34, the manager terminal 3 accepts a registration request for the additional information on the predetermined component from the manager together with the specification of a predetermined component (S401). Note that the registration request for the additional information can be recognized in which menu display is performed when the component is specified, for example, and the specification of the item of the registration request for the additional information shown in the menu display is performed is accepted.

The identification processing unit 32 recognizes the position specified by the manager based on the coordinates in the composite image, and thus identifies the component displayed at the coordinates as the component specified by the manager (S402). At the same time, the input processing unit 36 accepts the input of additional information from the manager by providing a column for the input of additional information on the manager terminal 3, for example (S403). The communication processing unit 37 transmits a registration request for the additional information on the specified component to the information processor 2 (S404).

Correspondingly to this, the information processor 2 makes reference to the component information storage unit 2A, and registers the additional information in the registration request as the component information on the specified component using the registration processing unit 22 (S405).

Thus, useful information is added, and accumulated information can be utilized by a plurality of managers, for example, who conducts the tasks or management of the semiconductor fabrication apparatus 1. Since additional information input work can be performed on the manager terminal 3 on which the components of the semiconductor fabrication apparatus 1 are displayed in an easy-to-understand manner, no mistake is made on the component to which additional information is inputted.

According to the management system for the semiconductor fabrication apparatus of the embodiment described above, in the semiconductor fabrication apparatus 1 composed of a plurality of components 1, the manager can identify the respective components by intuition, and hence tasks can be quickly and accurately performed. More specifically, since an integrated gas unit like the semiconductor fabrication apparatus 1 of the example has many automatic valve, and has a large number of air tubes, for example, that supply a drive pressure to move the automatic valves on the upper part of the valves, even though the marker M is attached to the top face of each of the valves, it is difficult to recognize the marker M, and since the fluid control device 1a is built in the semiconductor fabrication apparatus 1, a sufficient light quantity is not always obtained for all the fluid control devices 1a in the inside of the semiconductor fabrication apparatus 1 in maintenance. Thus, the marker M is attached to a place where the marker M is surely visually recognizable, the position of the component is identified from the relative coordinates relative to the marker M, and hence the respective components can be reliably identified.

In the case of information having a small confirmation frequency when a failure occurs, for example, the marker M is advantageous on the point of costs or the device size, compared with the provision of a display function, such as a liquid crystal, to the individual valves.

The structural diagram showing the inside of the semiconductor fabrication apparatus 1, such as the passage structure, using the composite image is displayed, and hence the structure of the semiconductor fabrication apparatus is easily understood without actually removing the cover, for example.

Subsequently, another example of a process of identifying a component in a management system for a semiconductor fabrication apparatus according to an embodiment will be described.

Figure 12:
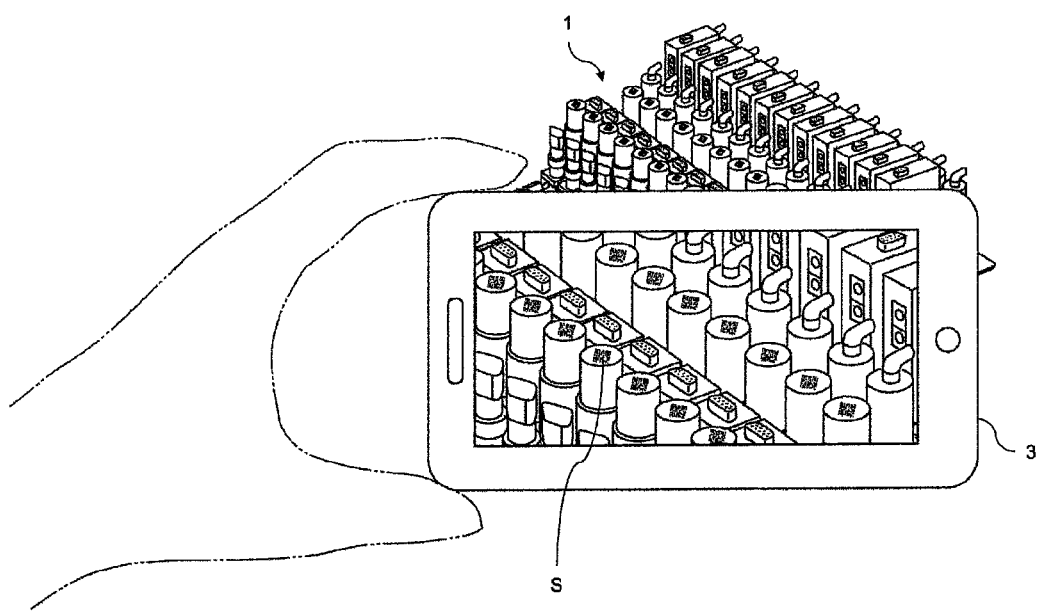
FIG. 12 is a diagram showing an exemplary screen displayed on a manager terminal in a management system for a semiconductor fabrication apparatus according to another embodiment of the present invention.

In this example, as shown in FIG. 12, a predetermined identification label S is attached to each of the components of a semiconductor fabrication apparatus 1. An identification processing unit 32 of a manager terminal 3 can identify the positions of the respective components by recognizing the identification labels S in the captured image of the semiconductor fabrication apparatus 1. As the example in FIG. 9, in the case in which the position of the component is to be identified based on the relative coordinates from a single marker M, errors occur in the angle direction on the recognized coordinates due to errors in the attachment accuracy of the marker M or in image recognition from the camera, sometimes leading to the degradation in positional accuracy at a place apart from the marker M. Therefore, the coordinates of the respective components are recognized based on a plurality of identification labels S apart from each other, and hence the influence of errors in the attachment accuracy of the respective identification labels S or in image recognition.

More specifically, in the case in which there are four or more identification labels S, the X-axis, the Y-axis, and the positive direction and the negative direction of each axis are noticed, and hence the positions of the respective components can be identified based on the coordinates of the respective identification labels S alone in the captured image on which the plurality of identification labels S is imaged, and the positions can be highly accurately identified with the cancelation of the influence of errors in the attachment angle of the respective identification labels S.

The identification label S can be formed of an apparatus ID unique to the semiconductor fabrication apparatus 1 and a pattern image that the unique ID is coded for each identification label S.

In the component information storage unit 2A, the ID unique to each identification label S is stored as component information, and another piece of component information is stored in association with the ID of the identification label S. Thus, the extraction and provision of component information corresponding to the identification label S and provision to the manager terminal 3 are made possible.

Note that, although in the management system for the semiconductor fabrication apparatus according to the embodiment described above, the capture of the semiconductor fabrication apparatus 1 and the display of the composite image are performed on the manager terminal 3, in another example, these processes can be performed on separate terminals or devices.

Figure 13:
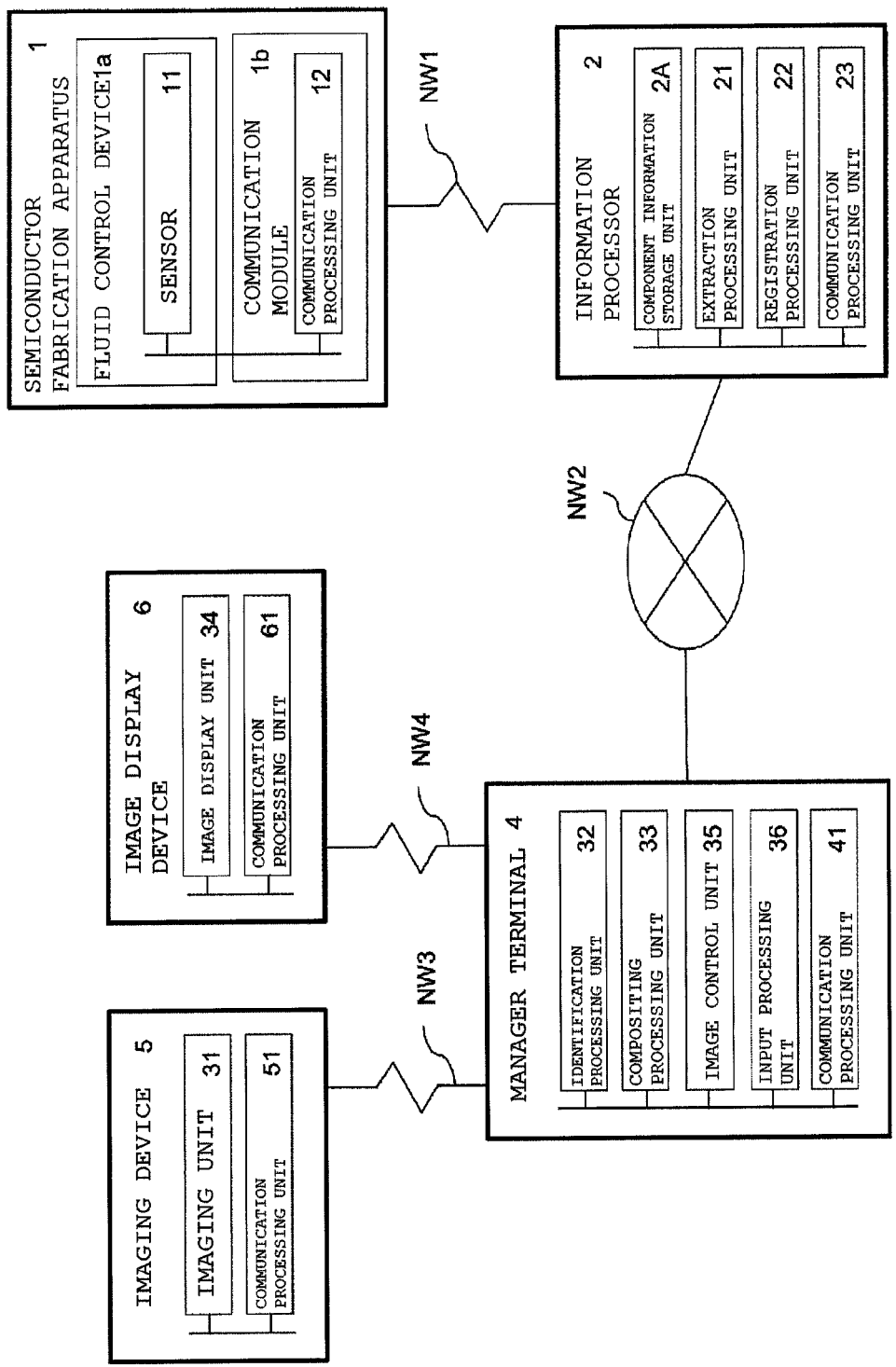
FIG. 13 is a functional block diagram showing the functions of the management system for the semiconductor fabrication apparatus according to another embodiment of the present invention.

FIG. 13 shows an exemplary device configuration in the case in which the capture of the semiconductor fabrication apparatus 1 and the display of the composite image are performed on separate terminals or devices.

In this example, in the functions included in the above-described manager terminal 3, the function of capture and the function of image display are respectively distributed on an imaging device 5 and an image display device 6, and the remaining functions are included in a manager terminal 4.

Note that in FIG. 13, in the functional units included in the imaging device 5 and the image display device 6, the functional units similar to the functional units included in the above-described manager terminal 3 are designated with the same reference signs.

The imaging device 5 is a device that is responsible for a capture function, and can be composed of a fixed point camera, for example, that captures the semiconductor fabrication apparatus 1.

This imaging device 5 has an imaging unit 31 and a communication processing unit 51. The communication processing unit 51 is a functional unit that executes the transmission and reception of data to and from the manager terminal 4, and is connected to the manager terminal 4 via a network NW3 configured of Bluetooth (registered trademark/trademark), infrared communication, or LAN, for example.

The image display device 6 is a device that displays a composite image, and can be composed of a liquid crystal monitor, a projector, and any other device, for example.

This image display device 6 has an image display unit 34 and a communication processing unit 61. Similarly to the communication processing unit 51, the communication processing unit 61 is a functional unit that executes the transmission and reception of data to and from the manager terminal 4, and is connected to the manager terminal 4 via a network NW4 configured of Bluetooth (registered trademark/trademark), infrared communication, or LAN, for example.

The manager terminal 4 has the functional units similar to the above-described manager terminal 3 except that the imaging unit 31 and the image display unit 34 are respectively provided on the imaging device 5 and the image display device and the communication processing unit 41 also has the functions of the transmission and reception of data to and from the imaging device 5 and the image display device 6 in addition to the functions of the transmission and reception of data to and from an information processor 2.

According to this embodiment, the embodiment is suitable for the case in which the imaging device 5 is disposed at a fixed point and the manager concentrates on the management word. When the image display device 6 is composed of a projector to display a composite image in a large side, this is suitable for the case in which confirmation is made by a plurality of managers.

Note that the embodiment is not limited to such an example, and configurations can also be provided in which the imaging device 5 alone is a separate device from the manager terminal 4 and the function of the image display unit 34 is included on the manager terminal 4, and in which conversely, the image display device 6 alone is a separate device from the manager terminal 4 and the function of the imaging unit 31 is included on the manager terminal 4.

Although in the embodiment described above, a composite image is created by the compositing processing unit 33, and the composite image is displayed using the image display unit 34 implemented by a liquid crystal display, in another embodiment, the image display unit 34 can also be implemented by a so-called smart glass (this is one of wearable terminals in a head mounted display method and an image is projected onto a transmission type display in a lens shape) or projection mapping, for example.

In this case, component information is projected onto the semiconductor fabrication apparatus 1 itself on which images are projected onto a transmission type display of a smart glass or in projection mapping, without compositing a captured image with component information. That is, as described above, since the positions of the respective components are identified based on the coordinate position relative to the marker M, component information is projected onto the position identified by coordinates information on the transmission type display or the semiconductor fabrication apparatus, and hence similarly to the above-described embodiment, component information on a predetermined component can be grasped by intuition.

In the embodiments described above, a configuration can also be provided in which a function of saving moving images is included in the manager terminal 3 or the manager terminal 4, and tasks can be captured as moving images while the manager is conducting the tasks.

Thus, the correct conducting of maintenance work, for example, can be proven later.

REFERENCE SIGNS LIST 1 semiconductor fabrication apparatus
1a fluid control device
11 sensor
1b communication module
12 communication processing unit
2 information processor
2A component information storage unit
21 extraction processing unit
22 registration processing unit
23 communication processing unit
3 manager terminal
31 imaging unit
32 identification processing unit
33 compositing processing unit
34 image display unit
35 image control unit
36 input processing unit
37 communication processing unit
4 manager terminal
41 communication processing unit
5 imaging device
51 communication processing unit
6 image display device
61 communication processing unit
NW1, NW2, NW3, NW4 network

The invention claimed is:

1. A management system for a semiconductor fabrication apparatus composed of a plurality of integrated components, wherein
  a manager terminal used by a manager managing the semiconductor fabrication apparatus and an information processor configured to hold component information on the semiconductor fabrication apparatus are communicably configured via a network,
  the manager terminal includes
    a capturing means configured to capture the semiconductor fabrication apparatus,
    a component information receiving means configured to receive component information on the semiconductor fabrication apparatus from the information processor,
    an identification processing means configured to identify a position of a component constituting the semiconductor fabrication apparatus on a captured image of the semiconductor fabrication apparatus,
    a compositing processing means configured to create a composite image in which component information on the identified component is composited with a captured image of the semiconductor fabrication apparatus at a position of the identified component, and an image display means configured to display the composite image, and the information processor includes a component information storing means configured to store component information on a component constituting the semiconductor fabrication apparatus, an extraction processing means configured to make reference to the component information storing means to extract the component information, and a component information transmitting means configured to transmit the component information to the manager terminal.

2. The management system for a semiconductor fabrication apparatus according to claim 1, wherein on the semiconductor fabrication apparatus, a marker is attached at a predetermined place, the identification processing means identifies a position of a component constituting the semiconductor fabrication apparatus on the captured image of the semiconductor fabrication apparatus based on relative coordinates of components relative to the attachment place of the marker, and the component information storing means further stores information relating to relative coordinates of components relative to the attachment place of the marker as component information.

3. The management system for a semiconductor fabrication apparatus according to claim 1, wherein the semiconductor fabrication apparatus has a predetermined identification label attached to four or more components, the identification processing means identifies a position of a component constituting the semiconductor fabrication apparatus on the captured image of the semiconductor fabrication apparatus based on relative coordinates of respective components relative to the attachment place of the identification label, and the component information storing means further stores information relating to relative coordinates of respective components relative to the attachment place of the identification label as component information.

4. The management system for a semiconductor fabrication apparatus according to claim 1, wherein the management system is communicably configured with the semiconductor fabrication apparatus via a network, the semiconductor fabrication apparatus has a sensing information transmitting means configured to transmit sensing information obtained by sensing operation status of respective components on the information processor, and the information processor further has a sensing information receiving means configured to receive the sensing information from the semiconductor fabrication apparatus, and a first registration means configured to make reference to the component information storing means to register the sensing information as the component information.

5. The management system for a semiconductor fabrication apparatus according to claim 1, wherein the manager terminal further has an input means configured to accept an input of additional information specifying a predetermined component on the composite image from the manager, and an additional information transmitting means configured to transmit the inputted additional information to the information processor together with specification of the predetermined component, and the information processor further has a second registration means configured to make reference to the component information storing means to register the additional information as the component information.

6. The management system for a semiconductor fabrication apparatus according to claim 1, wherein the manager terminal further has an image control means configured to detect an amount of movement according to movement of the manager terminal to control the composite image according to the amount of movement.

7. The management system for a semiconductor fabrication apparatus according to claim 1, wherein the manager terminal further has a recording means configured to record a task by the manager based on the composite image.

8. A management method for a semiconductor fabrication apparatus composed of a plurality of integrated components, wherein in a system in which a manager terminal used by a manager managing the semiconductor fabrication apparatus and an information processor including a component information storing means configured to store component information on a component constituting the semiconductor fabrication apparatus are communicably configured via a network, the manager terminal executes a capturing process of capturing the semiconductor fabrication apparatus, a component information receiving process of receiving component information on the semiconductor fabrication apparatus from the information processor, an identifying process of identifying a position of a component constituting the semiconductor fabrication apparatus on the captured image of the semiconductor fabrication apparatus, a compositing process of a creating a composite image in which component information on the identified component is composited with the captured image of the semiconductor fabrication apparatus at a position of the identified component, and an image display process of displaying the composite image, and the information processor executes an extracting process of making reference to the component information storing means to extract the component information, and a component information transmission process of transmitting the component information to the manager terminal.

9. A computer program stored on a non-transitory computer-readable medium for managing a semiconductor fabrication apparatus composed of a plurality of integrated components, wherein in a system in which a manager terminal used by a manager managing the semiconductor fabrication apparatus and an information processor including a component information storing means configured to store component information on a component constituting the semiconductor fabrication apparatus are communicably configured via a network, the computer program causes the manager terminal to execute a capturing process of capturing the semiconductor fabrication apparatus, a component information receiving process of receiving component information on the semiconductor fabrication apparatus from the information processor, an identifying process of identifying a position of a component constituting the semiconductor fabrication apparatus on the captured image of the semiconductor fabrication apparatus, a compositing process of a creating a composite image in which component information on the identified component is composited with the captured image of the semiconductor fabrication apparatus at a position of the identified component, and an image display process of displaying the composite image, and the computer program causes the information processor to execute an extracting process of making reference to the component information storing means to extract the component information, and a component information transmission process of transmitting the component information to the manager terminal.

* * * * *